United States Patent [19]

Matsumoto

[11] Patent Number: 5,065,051
[45] Date of Patent: Nov. 12, 1991

[54] ECL-TTL LEVEL CONVERTING CIRCUIT
[75] Inventor: Kouji Matsumoto, Tokyo, Japan
[73] Assignee: NEC Corporation, Tokyo, Japan
[21] Appl. No.: 346,160
[22] Filed: May 2, 1989
[30] Foreign Application Priority Data
  May 2, 1988 [JP] Japan .................................. 63-109665
[51] Int. Cl.$^5$ ................. H03K 19/092; H03K 19/086;
                               H03K 17/10; H03K 17/14
[52] U.S. Cl. .................................... 307/475; 307/473;
                                                307/455; 307/544
[58] Field of Search ............... 307/454, 455, 456, 459,
        307/467, 475, 355, 356, 358, 264, 260, 473, 551,
                                        458; 323/315-317; 330/257

[56]  References Cited
  U.S. PATENT DOCUMENTS
  4,644,194  2/1987  Birrittella et al. ................... 307/475
  4,684,831  8/1987  Kruest ............................. 307/455 X
  4,689,502  8/1987  Shimauchi et al. ............. 307/456 X
  4,883,990 11/1989  Umeki .............................. 307/475 X Primary Examiner—Stanley D. Miller
Assistant Examiner—David R. Bertelson
Attorney, Agent, or Firm—Helfgott & Karas

[57] ABSTRACT

An ECL-TTL level converting circuit comprises a first transistor having a collector connected to a ground line and an emitter connected to a negative voltage line through a constant current source, and a second transistor having a collector connected to a positive voltage line through a first resistor and an emitter commonly connected to the emitter of the first transistor. The base of one of the first and second transistors is connected to receive a reference voltage, and the base of the other of the first and second transistors is connected to receive an input signal. A third transistor is connected at its base to the collector of the second transistor and at its collector to the positive voltage line through a second resistor. An emitter of the third transistor is connected to the ground line through a third resistor and also connected to a base of a fourth transistor having an emitter connected to the ground line. A collector of the third transistor is connected to a base of a fifth transistor having a collector connected to the positive voltage line through a fourth resistor, and an emitter connected to a collector of the fourth transistor through a diode which is connected in a forward direction from the emitter of the fifth transistor to the collector of the fourth transistor. With this arrangement, an output signal can be obtained from the collector of the fourth transistor.

10 Claims, 4 Drawing Sheets

ECL-TTL LEVEL CONVERTING CIRCUIT

BACKGROUND OF THE INVENTION

1. Field of the invention

The present invention relates to an ECL-TTL level converting circuit, and more specifically to an ECL-TTL level converting circuit capable of preventing an increase of a low level potential due to parasitic resistance components of a package and the like.

2. Description of Related Art

Hitherto, so-called ECL-TTL level converting circuits have been widely used in conventional logic circuits for the purpose of interfacing between an ECL (emitter coupled logic) circuit and a TTL (transistor transistor logic) circuit. However, most of the conventional ECL-TTL circuits have such a circuit construction that when a low level signal of a TTL level is outputted, a maximum current is flowed into a ground. Therefore, a ground level will be increased by parasitic resistance components of a package and a ground line wiring of a voltage supply, with the result that a potential of the low level output signal will be adversely increased.

SUMMARY OF THE INVENTION

Accordingly, it is an object of the present invention to provide an ECL-TTL level converting circuit which has overcome the above mentioned defect of the conventional one.

Another object of the present invention is to provide an ECL-TTL level converting circuit capable of outputting of a low level signal having a stable potential which is not remarkably influenced by parasitic resistance components of a package and the like.

The above and other objects of the present invention are achieved in accordance with the present invention by an ECL-TTL level converting circuit comprising a first transistor having a collector connected to a ground line and an emitter connected to a negative voltage line through a constant current source, a second transistor having a collector connected to a positive voltage line through a first resistor and an emitter commonly connected to the emitter of the first transistor, the base of one of the first and second transistors being connected to receive a reference voltage and the base of the other of the first and second transistors being connected to receive an input signal, a third transistor having a collector connected to the positive voltage line through a second resistor, an emitter connected to the ground line through a third resistor and a base connected to the collector of the second transistor so that the collector of the third transistor outputs a first drive signal and the emitter of the third transistor outputs a second drive signal, an amplifying stage having an input connected to the collector of the third transistor, and a fourth transistor having a collector connected to an output side of the amplifying stage, an emitter connected to the ground line and a base connected to the emitter of the third transistor, so that an output signal can be obtained from the collector of the fourth transistor.

In a preferred embodiment, each of the third and fourth transistors is a Schottky diode transistor. In addition, the amplifying stage is composed of a fifth transistor having a collector connected to the positive voltage line through a fourth resistor, a base connected to the collector of the third transistor and an emitter connected to the collector of the fourth transistor through a diode which is connected in a forward direction from the emitter of the fifth transistor to the collector of the fourth transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
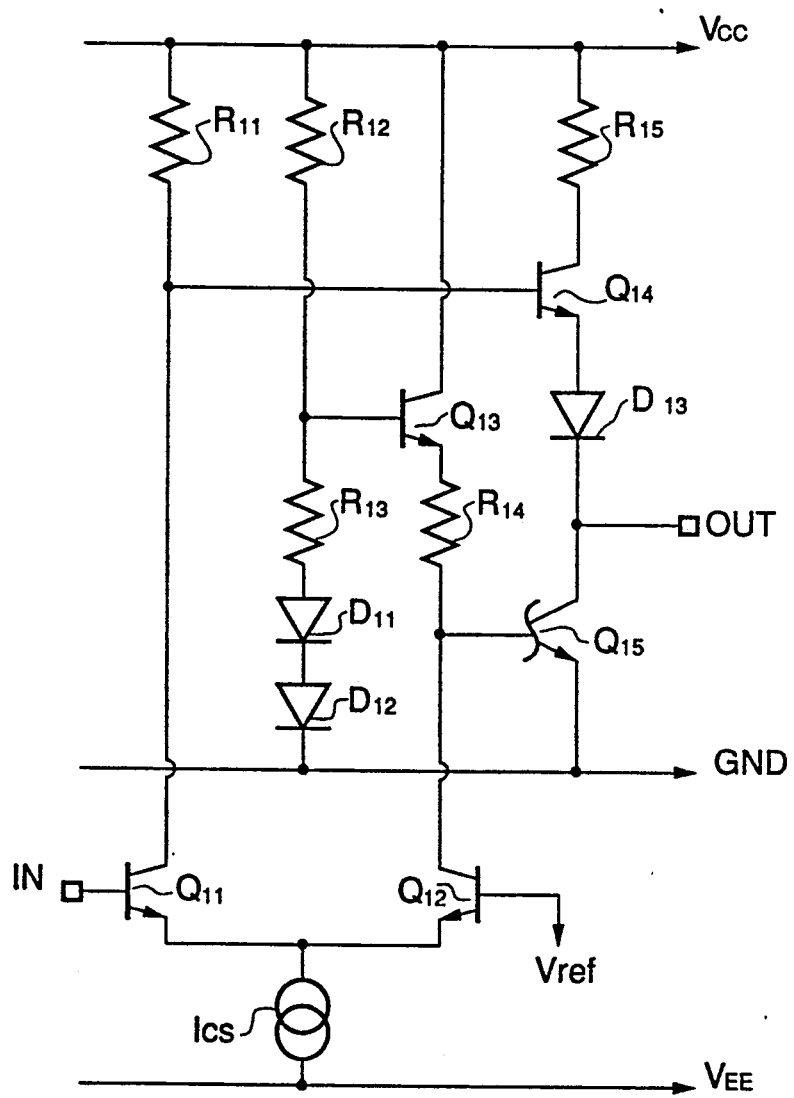
FIG. 1 is a circuit diagram of a typical example of a conventional ECL-TTL level converting circuit.

Referring to FIG. 1, there is shown a circuit diagram of a typical example of a conventional ECL-TTL level converting circuit. The shown ECL-TTL level converting circuit includes an emitter-coupled type differential amplifying circuit operating between a ground level GND and a negative electric supply voltage $V_{EE}$, and a TTL "totem pole" type output circuit operating between the ground level GND and a positive electric supply voltage $V_{CC}$.

The emitter-coupled type differential amplifying circuit includes a pair of transistors $Q_{11}$ and $Q_{12}$ having their commonly connected emitters which are connected through a constant current source $I_{CS}$ to the ground GND. A base of the transistor $Q_{11}$ is connected to an input terminal IN so as to receive an input signal of an ECL level, and a base of the transistor $Q_{12}$ is connected to receive a reference voltage $V_{ref}$.

A collector of the transistor $Q_{11}$ is connected to one end of a resistor $R_{11}$, which is in turn connected at its other end to the positive voltage line $V_{CC}$.

In addition, there is provided a bias circuit composed of a resistors $R_{12}$ and $R_{13}$ and diodes $D_{11}$ and $D_{12}$ connected in series between the positive voltage line $V_{CC}$ and the ground GND in the named order and in a forward direction. A transistor $Q_{13}$ is connected at its collector to the positive voltage $V_{CC}$, and at its base to a connection node between the resistors $R_{12}$ and $R_{13}$.

The collector of the transistor $Q_{11}$ is also connected to a base of an off-buffer side output transistor $Q_{14}$. On the other hand, a collector of the transistor $Q_{12}$ is connected to an emitter of the transistor $Q_{13}$ through a resistor $R_{14}$ and a base of an on-buffer side output transistor $Q_{15}$, which is in turn connected between an output terminal OUT and the ground GND. The transistor $Q_{15}$ is a so-called Schottky diode transistor which includes therein an integrated Schottky barrier diode in parallel with the base-collector junction. A collector of the transistor $Q_{14}$ is connected through a resistor $R_{15}$ to the positive voltage line $V_{CC}$, and an emitter of the transistor $Q_{14}$ is connected through a diode $D_{13}$ to the collector of the transistor $Q_{15}$.

The above mentioned ECL-TTL level converting circuit operates as follows:

When a high level signal is applied to the input terminal IN, the transistor $Q_{11}$ is turned on and the transistor $Q_{12}$ is turned off. Therefore, a constant current $I_{cs}$ flows through the resistor $R_{11}$ so that a voltage drop occurs across the resistor $R_{11}$. Accordingly, the transistor $Q_{14}$ is turned off, and therefore, a current does not flow through the diode $D_{13}$.

On the other hand, since the base potential of the transistor $Q_{15}$ will be increased so that the transistor $Q_{15}$ is turned on. As a result, a low level signal of the TTL level is outputted from the output terminal OUT.

If a low level signal is supplied to the input terminal IN, the transistor $Q_{14}$ is turned on so that a current flow through the diode D13. However, the transistor Q15 is turned off. Therefore, a high level signal of the TTL level is generated from the output terminal OUT.

Here, in order to realize the above mentioned operation, the circuit must be designed to fulfill the following conditions:

In order to realize the off operation of the transistor $Q_{14}$ and the diode $D_{13}$, the following relation must be satisfied:

$$V_{cc} - R_{11} \cdot I_{cs} - V_{OL} < V_{F(Q14)} + V_{F(D13)} \quad (1)$$

where $V_{OL}$ is a TTL output voltage of the low level;

$V_{F(Q14)}$ is a base-emitter voltage of the transistor $Q_{14}$ in the on condition; and $V_{F(D13)}$ is a forward direction voltage of the diode $D_{13}$ in the on condition.

The base potential of the transistor $Q_{15}$ is a value by transforming the bias voltage generated by the base bias circuit (the series circuit of the resistors $R_{12}$ and $R_{13}$ and the diodes $D_{11}$ and $D_{12}$ between the positive voltage Vcc and the ground GND) by means of an emitter follower composed of the transistor $Q_{13}$ and the resistor $R_{14}$.

In order to realize the off operation of the transistor $Q_{15}$, the following relation must be satisfied:

$$V_{F(D11)} + V_{F(D12)} + \{V_{CC} - V_{F(D11)} - V_{F(D12)}\} \cdot R_{13} \cdot /(R_{12}+R_{13}) - V_{F(Q13)} - R_{14} \cdot I_{CS} < V_{F(Q15)} \quad (2)$$

where $V_{F(D11)}$, $V_{F(D12)}$ is a forward direction voltage of the diodes $D_{11}$ and $D_{12}$;

$V_{F(Q15)}$ is a base-emitter voltage of the transistor $Q_{15}$ in the on condition; and $V_{F(Q13)}$ is a base-emitter voltage of the transistor $Q_{13}$ when the constant current Ics flows through the transistor $Q_{13}$.

In the above mentioned ECL-TTL level converting circuit, when a low level signal of a TTL level is outputted from the output terminal OUT, a maximum current is flowed into the ground GND. Therefore, the level of the ground GND is increased by parasitic resistance components of a package and ground line wirings of a voltage supply, with the result that a potential $V_{OL}$ of the TTL low level output signal is adversely increased.

A number of ECL-TTL level converting circuits are used in multipin type integrated circuits. If the ECL-TTL level converting circuits are simultaneously put in a condition of outputting a TTL low level signal, the increase of the potential of the ground level GND cannot be ignored in order to satisfy the output standard of the TTL low level (for example, $V_{OL} < 0.4$ V ($I_{OL}=4$ mA) and $V_{OL} < 0.5$ V ($I_{OL}=8$ mA) where $I_{OL}$ is an inflowing electric current through the output terminal at the time of the low level output).

Figure 2:
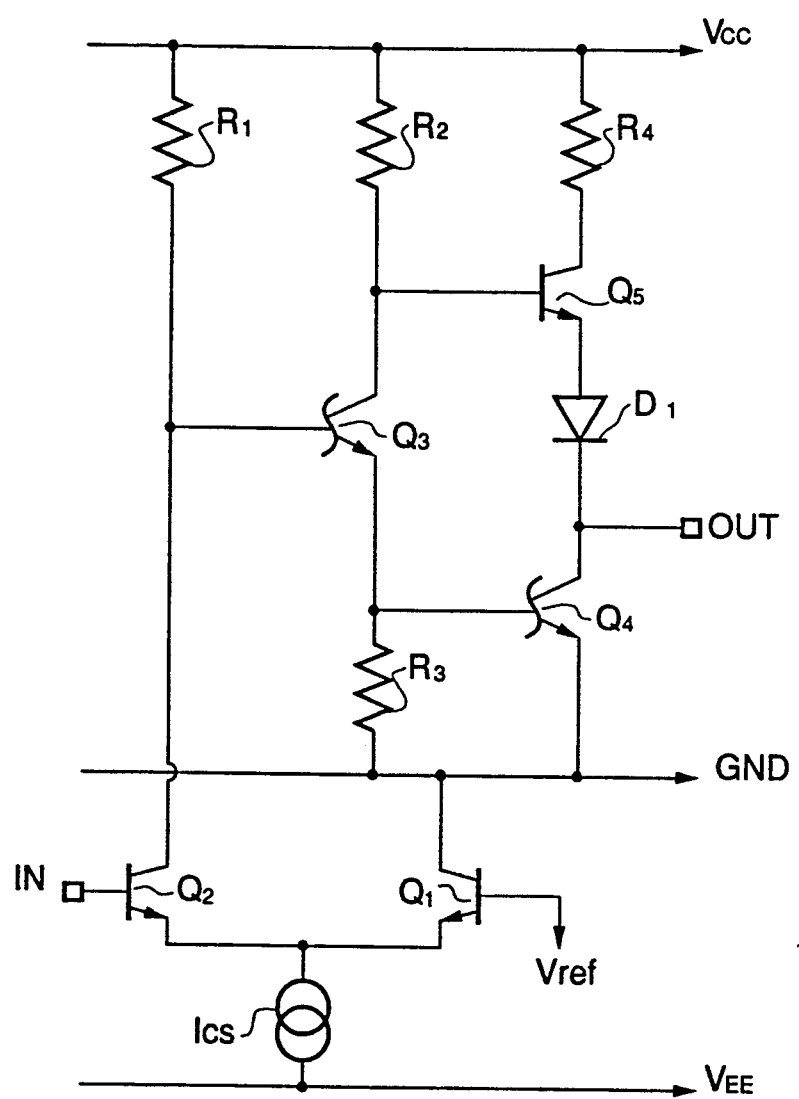
FIG. 2 is a circuit diagram of a first embodiment of an ECL-TTL level converting circuit in accordance with the present invention.

Referring to FIG. 2, there is shown a circuit diagram of a first embodiment of an ECL-TTL level converting circuit in accordance with the present invention. The shown ECL-TTL level converting circuit includes a first transistor $Q_1$ having a collector connected to a ground line GND and an emitter connected to a negative voltage line $V_{EE}$ through a constant current source $I_{CS}$. A base of the first transistor $Q_1$ is connected to receive a reference voltage $V_{ref}$. A second transistor $Q_2$ is connected at its collector to a positive voltage line $V_{CC}$ through a first resistor $R_1$. An emitter of the second transistor $Q_2$ is commonly connected to the emitter of the first transistor $Q_1$, and a base of the second transistor $Q_2$ is connected to an input terminal IN so as to receive an input signal. The collector of the second transistor $Q_2$ is also connected to a base of a third transistor $Q_3$, which is constituted of a Schottky diode transistor and is connected at its collector to the positive voltage line $V_{CC}$ through a second resistor $R_2$. An emitter of the third transistor $Q_3$ is connected to the ground line GND through a third resistor $R_3$ and also connected to a base of a fourth transistor $Q_4$. This fourth transistor $Q_4$ forms an on-buffer side transistor, and is constituted of a Schottky diode transistor and having an emitter connected to the ground line GND. The collector of the third transistor $Q_3$ is also connected to a base of a fifth transistor $Q_5$ having a collector connected to the positive voltage line $V_{CC}$ through a fourth resistor $R_4$, and an emitter connected to a collector of the fourth transistor $Q_4$ through a diode $D_1$ which is connected in a forward direction from the emitter of the fifth transistor $Q_5$ to the collector of the fourth transistor $Q_4$. The fifth transistor $Q_5$ forms an off-buffer side transistor.

Now, an operation of the ECL-TTL level converting circuit shown in FIG. 2 will be explained.

When the ECL level input signal appearing on the input terminal IN is a low level, the transistor $Q_1$ is turned on and the transistor $Q_2$ is turned off. Therefore, the constant current $I_{CS}$ will flow from the ground GND through the transistor $Q_1$ to the negative voltage $V_{EE}$, and on the other hand, the transistor $Q_3$ functioning as a phase division stage is brought into an on condition. Namely, since an electric current flows through the transistor $Q_3$, each of the resistors $R_2$ and $R_3$ generates a predetermined amount of voltage shift. In accordance with the respective voltage shift amounts of the resistors $R_2$ and $R_3$, the transistor $Q_4$ is turned on and the transistor $Q_5$ is turned off. Namely, a TTL low level signal is generated at the output terminal OUT.

On the other hand, if the ECL level input signal appearing on the input terminal IN is a high level, the transistors $Q_2$ and $Q_5$ are turned on, and the transistor $Q_1$ and $Q_4$ are turned off. Therefore, an electric current does not flow to the ground GND through the output terminal OUT, nor is the constant current $I_{CS}$ flows from the ground GND to the negative voltage $V_{EE}$. Namely, a TTL high level signal is generated at the output terminal OUT.

Figure 3:
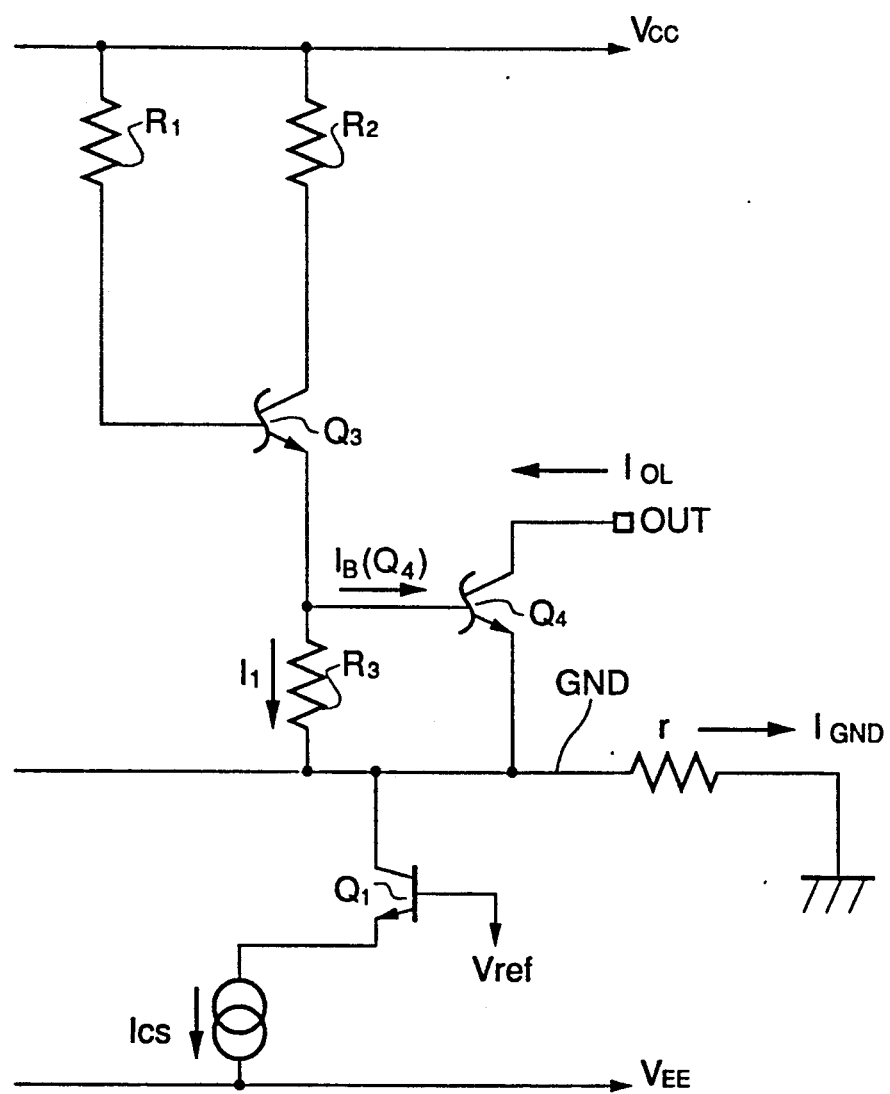
FIG. 3 is a circuit diagram illustrating the flow of current in the circuit shown in FIG. 2.

Here, with reference to FIG. 3, there will be explained a current flowing to and from the ground GND when the TTL low level signal is outputted from the ECL-TTL level converting circuit shown in FIG. 2.

Since the transistor Q4 is in the on condition, an electric current flowing to the ground GND includes an output terminal current $I_{OL}$, a base current $I_{B(Q4)}$ of the transistor Q4, and a current $I_1$ which generates across the resistor R3 a potential shift causing the transistor Q4 to turn on.

On the other hand, an electric current flowing from the ground GND includes the constant current $I_{CS}$ since the transistor Q1 is in the on condition.

Accordingly, a potential shift amount $\Delta V$ appearing on the ground GND for each one ECL-TTL level converting circuit shown in FIG. 2 can be expressed as follows:

$$DV = (I_{OL} + I_{B(Q4)} + I_1 - I_{CS}) \cdot r \quad (3)$$

Where
r is a parasitic resistance component of the ground line wiring system.
$I_1 = V_{F(Q4)}/R_3$ Namely, when the TTL low level signal is outputted, the transistor Q4 is in the on condition so that a load current flows from the output terminal OUT through the transistor Q4 to the ground GND. However, at this time, since the transistor Q2 is in the on condition to allow the constant current $I_{CS}$ to flow out of the ground GND to the negative voltage $V_{EE}$. In other words, not only a current flows into the ground, but also a current flows out of the ground. Therefore, the ground line current of the electric supply (through the resister "r" in FIG. 3) can be equivalently decreased, and accordingly, the potential increase of the ground level caused due to the parasitic resistance components "r" is effectively prevented. Thus, the increase of the TTL low level can be prevented.

Figure 4:
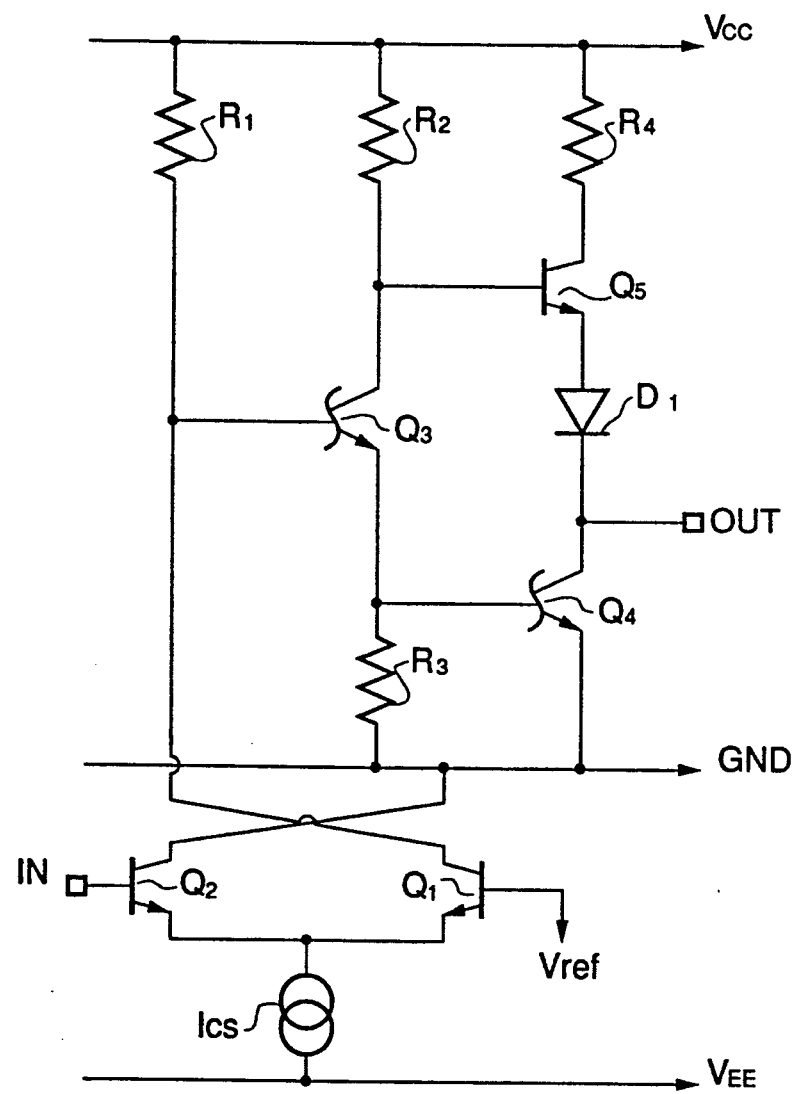
FIG. 4 is a circuit diagram of a second embodiment of an ECL-TTL level converting circuit in accordance with the present invention.

The ECL-TTL level converting circuit shown in FIG. 2 can be modified as shown in FIG. 4. Namely, the collector of the transistor Q1 is connected to the resistor R1 and the collector of the transistor Q2 is connected to the ground GND. Accordingly, the circuit shown in FIG. 4 constitutes an inverter circuit which generates, at the output OUT, a TTL output signal in a phase opposite to that of the input ECL signal appearing on the input IN.

Even in the circuit shown in FIG. 4, when the TTL low level signal is outputted, the transistor Q4 is in the on condition so that a load current flows through the transistor Q4 to the ground GND. However, at this time, since the transistor Q2 is in the on condition to allow the constant current $I_{CS}$ to flow out of the ground GND to the negative voltage $V_{EE}$. Therefore, the electric supply ground line current is correspondingly decreased, with the result that the increase of the ground potential caused due to the parasitic resistance components of the package and the electric supply ground line wiring is effectively prevented, and therefore, the increase of the TTL low level can be prevented.

As mentioned above, in the ECL-TTL level converting circuit as explained above in accordance with the present invention, a portion of the load current flowing through the output terminal to the ground is flowed out or discharged from the ground to the negative voltage through intermediary of the differential circuit, regardless of the non-inverting type or the inverting type. Therefore, the ground line current of the electric supply can be equivalently decreased, and accordingly, the increase of the ground potential caused due to the parasitic resistance components of the package and the ground line wiring of the electric supply is effectively prevented. Thus, the ECL-TTL level converting circuit in accordance with the present invention can effectively prevent the increase of the TTL low level signal, regardless of the non-inverting type or the inverting type.

The invention has thus been shown and described with reference to the specific embodiments. However, it should be noted that the present invention is in no way limited to the details of the illustrated structures but changes and modifications may be made within the scope of the appended claims.

I claim:

1. An ECL-TTL level converting circuit comprising a first transistor having a collector connected directly to a ground line and an emitter connected to a negative voltage line through a constant current source, a second transistor having a collector connected to a positive voltage line through a first resistor and an emitter commonly connected to the emitter of the first transistor, the base of one of the first and second transistors being connected to receive a reference voltage and the base of the other of the first and second transistors being connected to receive an ECL input signal, a third transistor having a collector connected to the positive voltage line through a second resistor, an emitter connected to the ground line through a third resistor and a base connected to the collector of the second transistor so that the collector of the third transistor outputs a first drive signal and the emitter of the third transistor outputs a second drive signal, an amplifying stage having an input connected to the collector of the third transistor, and a fourth transistor having a collector connected to an output side of the amplifying stage, an emitter connected to the ground line and a base connected to the emitter of the third transistor, so that a TTL output signal can be obtained from the collector of the fourth transistor, whereby, when the first transistor is put in a conductive condition, the fourth transistor is brought into a conductive condition so that a current flows from the collector of the fourth transistor through the fourth transistor into the ground line so as to output a TTL low level signal from the collector of the fourth transistor and, at the same time, a portion of the current flowing from the collector of the fourth transistor into the ground line is caused to flow from the ground line into the negative voltage line, thereby suppressing an increase of a current flowing through the ground line to an exterior of the ECL-TTL level converting circuit.

2. A circuit claimed in claim 1 wherein each of the third and fourth transistors is a Schottky diode transistor.

3. A circuit claimed in claim 1 wherein the amplifying stage is composed of a fifth transistor having a collector connected to the positive voltage line through a fourth resistor, a base connected to the collector of the third transistor and an emitter connected to the collector of the fourth transistor through a diode which is connected in a forward direction from the emitter of the fifth transistor to the collector of the fourth transistor.

4. A circuit claimed in claim 3 wherein each of the third and fourth transistors is a Schottky diode transistor.

5. An ECL-TTL level converting circuit comprising a first transistor having a collector connected directly to a ground line and an emitter connected to a negative voltage line through a constant current source, a second transistor having a collector connected to a positive voltage line through a first resistor and an emitter commonly connected to the emitter of the first transistor, the base of one of the first and second transistors being connected to receive a reference voltage and the base of the other of the first and second transistors being connected to receive an ECL input signal, a third transistor having a collector connected to the positive voltage line through a second resistor, an emitter connected to the ground line through a third resistor and a base connected to the collector of the second transistor so that the collector of the third transistor outputs a first drive signal and the emitter of the third transistor outputs a second drive signal, an amplifying stage operating in accordance with the first drive signal, and a fourth transistor having a collector connected to an output side of the amplifying stage, an emitter connected to the ground line and a base connected to receive the second drive signal so that a TTL output signal can be obtained from the collector of the fourth transistor, whereby, when the first transistor is put in a conductive condition, the fourth transistor is brought into a conductive condition so that a current flows from the collector of the fourth transistor through the fourth transistor into the ground line so as to output a TTL low level signal from the collector of the fourth transistor and, at the same time, a portion of the current flowing from the collector of the fourth transistor into the ground line is caused to flow from the ground line into the negative voltage line, thereby suppressing an increase of a current flowing through the ground line to an exterior of the ECL-TTL level converting circuit.

6. A circuit claimed in claim 5 wherein each of the third and fourth transistors is a Schottky diode transistor.

7. A circuit claimed in claim 6 wherein the amplifying stage is composed of a fifth transistor having a collector connected to the positive voltage line through a fourth resistor, a base connected to receive the first drive signal and an emitter connected to the collector of the fourth transistor through a diode which is connected in a forward direction from the emitter of the fifth transistor to the collector of the fourth transistor.

8. An ECL-TTL level converting circuit comprising a first transistor having a collector connected directly to a ground line and an emitter connected to a negative voltage line through a constant current source, a second transistor having a collector connected to a positive voltage line through a first resistor and an emitter commonly connected to the emitter of the first transistor, the base of one of the first and second transistors being connected to receive a reference voltage and the base of the other of the first and second transistors being connected to receive an ECL input signal, a third transistor having a collector connected to the positive voltage line through a second resistor, an emitter connected to the ground line through a third resistor and a base connected to the collector of the second transistor, and a fourth transistor having an emitter connected to the ground line and a base connected to the emitter of the third transistor, so that a TTL output signal can be obtained from a collector of the fourth transistor, whereby, when the first transistor is put in a conductive condition, the fourth transistor is brought into a conductive condition so that a current flows from the collector of the fourth transistor through the fourth transistor into the ground line so as to output a TTL low level signal from the collector of the fourth transistor, and, at the same time, a portion of the current flowing from the collector of the fourth transistor into the ground line is caused to flow from the ground line into the negative voltage line, thereby suppressing an increase of a current flowing through the ground line to an exterior of the ECL-TTL level converting circuit.

9. A circuit claimed in claim 8 wherein each of the third and fourth transistors is a Schottky diode transistor.

10. A circuit claimed in claim 9 further including a fifth transistor having a collector connected to the positive voltage line through a fourth resistor, a base connected to the collector of the third transistor and an emitter connected to the collector of the fourth transistor through a diode which is connected in a forward direction from the emitter of the fifth transistor to the collector of the fourth transistor.

* * * * *